United States Patent
Cherigui et al.

(10) Patent No.: US 10,104,479 B2
(45) Date of Patent: Oct. 16, 2018

(54) METHOD FOR OPERATING A HEARING DEVICE AND A HEARING DEVICE OPTIMIZED FOR BEING POWERED BY A MERCURY-FREE BATTERY

(71) Applicant: Sonova AG, Stäfa (CH)

(72) Inventors: Fethi Cherigui, Adliswü (CH); Jürg Sudan, Gündisau (CH)

(73) Assignee: Sonova AG, Staefa (CH)

( * ) Notice: Subject to any disclaimer, the term of this patent is extended or adjusted under 35 U.S.C. 154(b) by 0 days.

(21) Appl. No.: 15/038,431

(22) PCT Filed: Dec. 4, 2013

(86) PCT No.: PCT/EP2013/075522
§ 371 (c)(1),
(2) Date: May 20, 2016

(87) PCT Pub. No.: WO2015/081995
PCT Pub. Date: Jun. 11, 2015

(65) Prior Publication Data
US 2016/0295334 A1    Oct. 6, 2016

(51) Int. Cl.
*H04R 25/00* (2006.01)
*G06F 1/24* (2006.01)
(Continued)

(52) U.S. Cl.
CPC .............. *H04R 25/305* (2013.01); *G06F 1/24* (2013.01); *G06F 1/30* (2013.01); *H02J 7/007* (2013.01);
(Continued)

(58) Field of Classification Search
USPC ...................... 307/11, 31; 320/166; 323/282; 330/297; 381/81; 429/7
See application file for complete search history.

(56) References Cited

U.S. PATENT DOCUMENTS 3,530,333 A * 9/1970 Roberts .................. B60Q 9/001
                                                                315/360
3,575,442 A * 4/1971 Elliott ................ B60G 17/0155
                                                                267/64.16
(Continued)

FOREIGN PATENT DOCUMENTS

JP          08-308148 A      11/1996

OTHER PUBLICATIONS

PCT Search Report dated Jul. 8, 2014 for PCT App. Ser. No. PCT/EP2013/075522.

*Primary Examiner* — Yogeshkumar Patel
(74) *Attorney, Agent, or Firm* — Henricks Slavin LLP

(57) ABSTRACT

The present invention proposes a method for operating a hearing device 1 which prevents battery leakage, especially in the case when the hearing device 1 is powered by a mercury-free battery 2. The method comprises monitoring a supply voltage of at least one of a plurality of electronic units 7, 8, 9 of the hearing device 1, initiating a low battery leakage shutdown state when a low supply voltage condition is identified based on the monitoring, wherein the initiating a low battery leakage shutdown state includes activating at least one power gate 10 to disconnect at least one of the plurality of electronic units 7, 8, 9 from the power supply when entering the low battery leakage shutdown state, and discharging a buffer capacitor 4 provided for stabilizing the battery voltage. Moreover, a hearing device 1 optimized for being powered by a mercury-free battery 2 is provided.

22 Claims, 2 Drawing Sheets

(51) Int. Cl.
    *H02J 7/00*           (2006.01)
    *H03K 17/22*         (2006.01)
    *H04R 1/10*           (2006.01)
    *G06F 1/30*           (2006.01)
    *H03K 17/30*         (2006.01)
    *H02J 7/34*           (2006.01)

(52) U.S. Cl.
    CPC .......... *H02J 7/0031* (2013.01); *H02J 7/0063* (2013.01); *H03K 17/22* (2013.01); *H04R 1/1091* (2013.01); *H02J 7/345* (2013.01); *H02J 2007/004* (2013.01); *H03K 17/302* (2013.01); *H04R 2225/31* (2013.01); *H04R 2225/33* (2013.01); *H04R 2460/03* (2013.01)

(56) References Cited

U.S. PATENT DOCUMENTS

| | | | | |
|---|---|---|---|---|
| 4,358,750 A | * | 11/1982 | Webster | B60R 25/1007 200/61.45 R |
| 4,843,374 A | * | 6/1989 | Sansky | G08B 13/08 200/61.62 |
| 5,961,443 A | * | 10/1999 | Rastatter | A61F 5/58 600/23 |
| 6,256,479 B1 | * | 7/2001 | Hoffmann | H04M 11/025 455/410 |
| 6,268,710 B1 | * | 7/2001 | Koga | G01R 31/3624 320/116 |
| 6,404,165 B1 | * | 6/2002 | Shinpo | B60L 11/1851 307/10.7 |
| 6,410,997 B1 | * | 6/2002 | Sjursen | H01M 2/1044 307/130 |
| 6,748,089 B1 | * | 6/2004 | Harris | H03G 3/3026 381/104 |
| 8,148,954 B1 | * | 4/2012 | Kehlstadt | H01M 10/46 320/166 |
| 2002/0094098 A1 | * | 7/2002 | Delage | H04R 25/55 381/312 |
| 2002/0097543 A1 | * | 7/2002 | Pannwitz | H02J 7/0031 361/90 |
| 2005/0095564 A1 | * | 5/2005 | Stuart | G09B 19/04 434/112 |
| 2006/0089522 A1 | * | 4/2006 | Rastatter | A61F 5/58 600/23 |
| 2007/0008752 A1 | * | 1/2007 | Senouci | H03K 3/02337 363/49 |
| 2007/0049788 A1 | * | 3/2007 | Kalinowski | A61F 5/58 600/23 |
| 2009/0143797 A1 | * | 6/2009 | Smith | A61B 17/1285 606/169 |
| 2009/0143805 A1 | * | 6/2009 | Palmer | A61B 17/320092 606/169 |
| 2010/0000074 A1 | * | 1/2010 | Smith | A61B 17/320092 29/594 |
| 2010/0004668 A1 | * | 1/2010 | Smith | A61B 17/320092 606/169 |
| 2010/0004669 A1 | * | 1/2010 | Smith | A61B 17/320068 606/169 |
| 2010/0097029 A1 | * | 4/2010 | McCabe | B60L 11/005 320/103 |
| 2010/0313270 A1 | * | 12/2010 | Kim | G06F 1/28 726/24 |
| 2011/0009890 A1 | * | 1/2011 | Palmer | A61B 17/320092 606/169 |
| 2011/0167619 A1 | * | 7/2011 | Smith | A61B 17/320092 29/594 |
| 2011/0257650 A1 | * | 10/2011 | Deville | A61B 17/320092 606/45 |
| 2012/0071796 A1 | * | 3/2012 | Smith | A61B 17/320092 601/3 |
| 2012/0078278 A1 | * | 3/2012 | Bales, Jr. | A61B 17/320092 606/169 |
| 2012/0221031 A1 | * | 8/2012 | Smith | A61B 17/1285 606/169 |
| 2012/0277780 A1 | * | 11/2012 | Smith | A61B 17/320092 606/169 |
| 2012/0313701 A1 | * | 12/2012 | Khlat | H02M 3/07 330/127 |
| 2013/0046290 A1 | * | 2/2013 | Palmer | A61B 17/320092 606/1 |
| 2013/0154672 A1 | * | 6/2013 | Fabregas | G01R 31/3606 324/713 |
| 2013/0285605 A1 | * | 10/2013 | Partovi | H02J 7/0042 320/108 |
| 2013/0293248 A1 | * | 11/2013 | Ho | B60L 3/0007 324/750.01 |
| 2013/0322197 A1 | * | 12/2013 | Schiller | G11C 5/141 365/226 |
| 2014/0191568 A1 | * | 7/2014 | Partovi | H02J 7/025 307/9.1 |

* cited by examiner

METHOD FOR OPERATING A HEARING DEVICE AND A HEARING DEVICE OPTIMIZED FOR BEING POWERED BY A MERCURY-FREE BATTERY

CROSS-REFERENCE TO RELATED APPLICATIONS

This application is the U.S. National Stage of PCT App. Ser. No. PCT/EP2013/075522, filed Dec. 4, 2013.

TECHNICAL FIELD

The present invention pertains to a method for operating a hearing device, in particular a hearing device powered by a mercury-free battery, as well as to a hearing device optimised for being powered by a mercury-free battery. The present invention is especially related to miniature hearing devices adapted to be worn at an ear or at least partially within an ear canal of a user. Such hearing devices include ear phones, communication devices, hearing aids (also referred to as hearing prostheses or hearing instruments) for hard of hearing people or hearing enhancement devices for augmenting the hearing capability of normal hearing persons, as well as hearing protection devices designed to prevent noise-induced hearing loss.

BACKGROUND OF THE INVENTION

Miniature hearing devices are commonly powered by mercury-free zinc air button cell batteries. Mercury-free zinc air battery cells suffer from gassing, which happens after deep discharge when the battery stays (e.g. is forgotten) in the battery compartment of a hearing device for a prolonged period of time. This may lead to battery leakage. Therefore, deep discharge of mercury-free battery cells should be prevented.

Some known hearing devices may be switched off by disconnecting the battery from the electronic circuitry. This can for instance be achieved by opening the battery door, thereby releasing the battery from the electrical battery contacts. In this way discharging of the battery is minimised.

Some other known hearing devices may enter into a "powerdown" state upon the user issuing an "off" command, such as for instance by flipping an on/off switch. In this off/powerdown state certain triggers are still monitored by the hearing device, which may then lead to waking up the hearing device again, e.g. by the user issuing an "on" command, for instance by actuating a user control element. In order to monitor wake-up triggers at least some of the electrical circuitry of the hearing device must be supplied with power, even when the hearing device is not actually being used. The hearing device may automatically enter into a "shutdown" state once the battery gets weak. The residual current in the shutdown state may result in battery deep discharge and gassing, when for instance the battery cell is forgotten in the hearing device.

Known hearing devices employ power supply coupling or buffer capacitors. The buffer capacitor for instance absorbs loudspeaker current peaks and stabilises the whole electrical system of the hearing device. Furthermore, the buffer capacitor provides a continual power supply during phases when the battery is briefly disconnected from the electrical battery contacts, for instance when the battery compartment or door is opened for a short amount of time (e.g. to replace the battery) or as a result of power glitches, i.e. short interruptions of the battery supply voltage due to mechanical vibrations or shocks. The provision of a large buffer capacitor can however result in unwanted deadlock situations, where the hearing device will not perform a power on reset (POR) and remain inoperable despite replacing a depleted battery with a new one, leading to confusion and frustration of the user. The latter problem is especially acute in the case where the residual drain current in the shutdown state is minimised in order to avoid deep discharging of a battery, especially of a mercury-free battery. The stated deadlock situation can occur when the supply voltage is required to make a transition from below across a pre-set threshold value in order to trigger a POR and switch the hearing device from the shutdown state into a normal operation state. In case the buffer capacitor is discharged very slowly because the residual drain current is very small, the supply voltage may not have dropped below the threshold value by the time the battery is replaced and therefore the required transition will not occur, and hence no POR will be triggered.

SUMMARY OF THE INVENTION

It is a goal of the present invention to provide a method for operating a hearing device which prevents battery deep discharge, especially for the case when the hearing device is powered by a mercury-free battery. It is a further object of the present invention to avoid unwanted deadlock situations, where the hearing device will not perform a power on reset (POR) and remain inoperable despite replacing a depleted battery with a new one. These objects are reached by the method for operating a hearing device according to claim 1.

It is a further goal of the present invention to provide a hearing device which is optimised for being powered by a mercury-free battery. Such a hearing device is specified in claim 8.

Specific embodiments of the present invention are provided in the dependent claims.

The present invention is first directed to a method for operating a hearing device comprising a power management unit, a loudspeaker and a plurality of electronic units, such as for instance a control unit, a signal processing unit, a memory unit, a wireless transceiver unit and an amplifier, the method comprising the steps of:

a) powering the plurality of electronic units by means of a battery providing a battery voltage;
b) stabilising the battery voltage by means of a buffer capacitor connected parallel to the battery, and thus providing a supply voltage;
c) monitoring the supply voltage of at least one of the plurality of electronic units;
d) initiating a low battery leakage shutdown state when a low supply voltage condition is identified based on the monitoring;

wherein the initiating a low battery leakage shutdown state is characterised by
    activating at least one power gate to disconnect at least one of the plurality of electronic units from the supply voltage when entering the low battery leakage shutdown state;
    discharging the buffer capacitor.

In an embodiment of the method the step c) of monitoring comprises at least one of the following steps:
c1) determining a state of charge of the battery;
c2) performing supply voltage glitch detection.

In a further embodiment of the method the step c1) of determining comprises identifying a low supply voltage condition when the supply voltage drops below a minimum voltage threshold.

In a further embodiment of the method the step c2) of performing supply voltage glitch detection comprises identifying a low supply voltage condition when the supply voltage drops below a pre-defined glitch threshold for a (contiguous) timespan longer than a pre-determined maximum glitch timespan.

In a further embodiment the method further comprises the step of resetting at least one of the plurality of electronic units when the supply voltage drops below the pre-defined glitch threshold for a (contiguous) timespan shorter than or equal to the pre-determined maximum glitch timespan.

In a further embodiment of the method the step c1) of monitoring further comprises a second monitoring, comprising monitoring of a current consumed by at least one of the plurality of electronic units of the hearing device. In this embodiment the minimum supply voltage threshold depends on this second monitoring, in particular the minimum supply voltage threshold is set in dependence of the current consumed by at least one of the plurality of electronic units.

In a further embodiment of the method discharging the buffer capacitor is achieved by opening the battery door, in particular by mechanically dislodging the battery from at least one battery contact of the hearing device.

In a further embodiment of the method discharging is discontinued when the supply voltage, i.e. the voltage across the buffer capacitor, drops below a pre-defined minimum buffer voltage threshold, wherein in particular the minimum buffer voltage is pre-defined so as to ensure that the battery is not deeply discharged, and wherein more particularly the minimum buffer voltage threshold is within the range from 0.3 V to 0.7 V.

The present invention is further directed to a hearing device suitable for being powered by a mercury-free battery, comprising:
  battery contacts for engaging with a battery;
  a loudspeaker;
  a plurality of electronic units, such as for instance a control unit, a signal processing unit, a memory unit, a wireless transceiver unit, and an amplifier;
  a buffer capacitor operationally connected to the battery contacts for stabilising a battery voltage and provide a supply voltage to the plurality of electronic units;
  a power management unit adapted to monitoring the supply voltage and identifying a low supply voltage condition;
  at least one power gate adapted to disconnect at least one of the plurality of electronic units from the power supply when a low supply voltage condition is detected, the power gate being controllable by the power management unit;
  discharging means adapted to discharge the buffer capacitor.

In an embodiment of the hearing device the power management unit is further capable of at least one of:
  determining a state of charge of the battery;
  performing supply voltage glitch detection.

In a further embodiment of the hearing device the power management unit is further adapted to detect a low supply voltage condition when the supply voltage drops below a minimum voltage threshold.

In a further embodiment of the hearing device the power management unit as part of performing supply voltage glitch detection is further adapted to detect a low supply voltage condition when the supply voltage drops below a pre-defined glitch threshold for a (contiguous) timespan longer than a pre-determined maximum glitch timespan.

In a further embodiment of the hearing device the power management unit is further adapted to initiate a reset of at least one of the plurality of electronic units if the supply voltage drops below the pre-defined glitch threshold for a (contiguous) timespan shorter than or equal to the pre-determined maximum glitch timespan.

In a further embodiment of the hearing device the power management unit is further adapted to monitor a current consumed by at least one of the plurality of electronic units and to set or adjust the minimum voltage threshold in dependence of the current consumed by the at least one of the electronic units.

In a further embodiment of the hearing device the discharging means is adapted to discharge the buffer capacitor when a low supply voltage condition is detected.

In a further embodiment of the hearing device the discharging means is operationally connected with a battery door of the hearing device and adapted to establish an electrical connection between the battery contacts and ground via the discharging means when the battery door is opened and to interrupt said electrical connection by removing the discharging means from said electrical connection when the battery door is closed.

In a further embodiment of the hearing device the discharging means comprises an electrical circuit adapted to discontinue discharging when the voltage across the buffer capacitor drops below a pre-defined minimum buffer voltage threshold, wherein in particular the minimum buffer voltage threshold is pre-defined to ensure that the battery is not deeply discharged, wherein more particularly the minimum buffer voltage threshold is within the range from 0.3 V to 0.7 V.

It is pointed out that combinations of the above-mentioned embodiments give rise to even further, more specific embodiments according to the present invention.

BRIEF DESCRIPTION OF THE DRAWINGS

The present invention is further explained below by means of non-limiting exemplary embodiments and with reference to the accompanying drawings, which show.

In the figures, like reference signs refer to like parts.

DETAILED DESCRIPTION OF THE INVENTION

Figure 1:
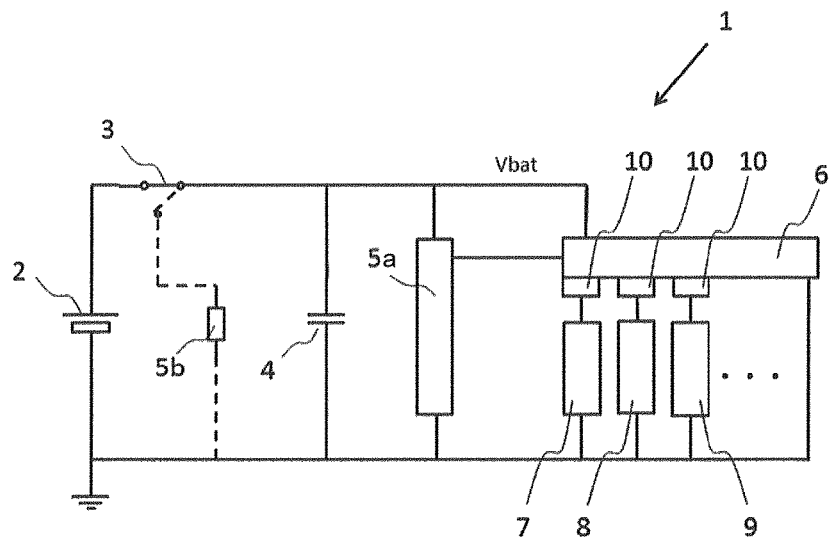
FIG. 1 a simplified schematic diagram of an exemplary embodiment a hearing device according to the present invention.

As previously indicated the present invention is related to a variety of different types of miniature ear-level hearing devices including ear phones, communication devices, hearing aids, hearing enhancement devices and hearing protection devices. All these types of hearing devices have in common that they are powered by a battery and feature a miniature loudspeaker (typically also referred to as "receiver") in order to output sound into an ear canal of the user. Depending on the specific application, they may further comprise a microphone, a control unit, a signal processing unit, a memory unit and/or a wireless transceiver unit. FIG. 1 illustrates a simplified schematic diagram of an exemplary embodiment a hearing device 1 according to the present invention. It includes a battery 2, which today is usually required to be a mercury-free battery, for powering the hearing device 1. The battery 2 is inserted into a battery compartment of the hearing device 1, which contains battery contacts. The battery 2 can be replaced by opening the battery door which gives access to the battery compartment. Many times the battery door is designed such that by opening the battery door the battery 2 is dislodged from the battery contacts and the hearing device 1 is turned off. Conversely, by closing the battery door the battery 2 is brought into contact with the battery contacts and the hearing device 1 is turned on. This mechanism is represented by the switch 3. The hearing device 1 further includes a coupling or buffer capacitor 4. This buffer capacitor 4 for instance absorbs loudspeaker current peaks and stabilises the electronics of the hearing device 1. Furthermore, the buffer capacitor 4 provides a continual power supply during phases when the battery 2 is briefly disconnected from the battery contacts. The hearing device 1 further comprises a plurality of electronic unit, such as a power management unit 6, a micro-controller 7, a signal processing unit 8 (such as a digital signal processor, DSP) and an amplifier 9 which provides the signal that drives the loudspeaker (not shown in FIG. 1). As indicated above the hearing device 1 may also include a wireless transceiver (not shown in FIG. 1). Furthermore, the hearing device 2 also comprises one or more memory units (not shown in FIG. 1), such as for instance a non-volatile memory (NVM) like an EEPROM. The purpose of the power management unit 6 is to monitor the supply voltage of the electronic units 7, 8, 9. The power management unit 6 may also be adapted to monitor the current consumed by at least one of the electronic units 7, 8, 9. The power management unit 6 may also be able to detect the battery end-of-life or estimate a remaining battery-lifetime.

When a low supply voltage condition is detected the power management unit 6 will initiate a low battery leakage shutdown state. This is for instance communicated to the electronic units 7, 8, 9 by means of a high-priority interrupt, upon which all the electronic units 7, 8, 9 except the power management unit 6 will complete any crucial operations, such as writing data to memory, and then enter into the shutdown state. Additionally, the power management unit 6 will activate power gates 10, which will disconnect the electronic units 7, 8, 9 from the power supply, i.e. the supply voltage, thus considerably reducing the load of the battery 2 so that deep discharge is avoided.

The battery door may be adapted to not only disconnect the battery 2 from the battery contacts when opening the battery door and therewith the switch 3, but also to provide an electrical connection across the buffer capacitor 4, for instance via a resistor 5b, in order to discharge the buffer capacitor 4 when the battery door is opened. This optional connection is illustrated by means of dashed lines in FIG. 1. The resistor 5b is electrically disconnected from the buffer capacitor 4 when the battery door is closed. The resistor 5b together with the switch 3 together form a first embodiment of a discharging means according to the present invention.

Figure 2:
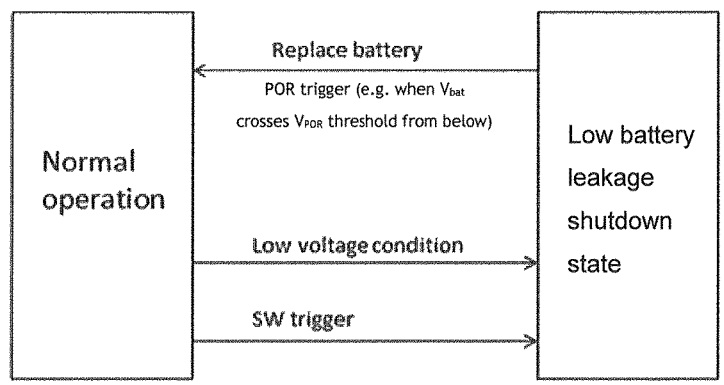
FIG. 2 a simple exemplary state diagram for a hearing device according to the present invention.

FIG. 2 depicts a simple exemplary state diagram for a hearing device according to the present invention. As can be seen from FIG. 2 two different triggers can lead to a change of the state of the hearing device 2 from the "normal operation state" to the "low battery leakage shutdown state".

The trigger can be based on low voltage detection as for instance determined by a battery end of life (EOL) detection means, e.g. using battery voltage monitoring. This can be achieved by detecting when the battery voltage drops below a minimum voltage threshold. Not only the supply voltage but also the current consumed by at least one of the plurality of electronic units 7, 8, 9 may be monitored. The minimum voltage threshold can then be set or adjusted dependent on the current consumption of at least one of the plurality of electronic units 7, 8, 9. Such monitoring could be done over a certain period of time. Low voltage detection could also comprise a voltage glitch detection (VGD) scheme. The latter detects temporary voltage drops or short power interruptions for instance due to mechanical vibrations or shocks leading to a short-term disconnection of the battery 2 from at least one battery contact. Alternatively, a control unit can issue software (SW) trigger such as an interrupt in order to force the electronic units 7, 8, 9 into the low battery leakage shutdown state.

Figure 3:
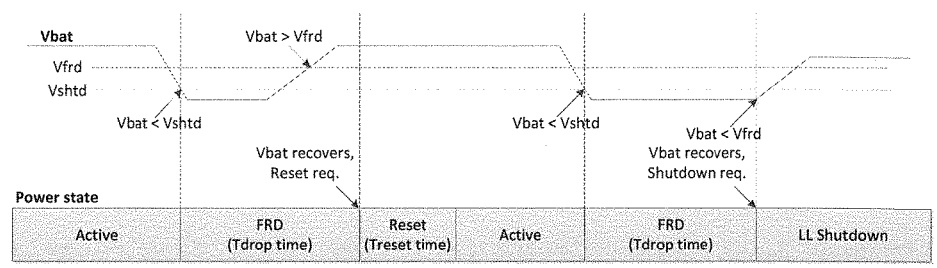
FIG. 3 an exemplary timing diagram illustrating voltage glitch detection and triggering of the shutdown state for a hearing device according to the present invention.

As can be seen in the exemplary timing diagram of FIG. 3 the voltage glitch detector (which is part of the power management unit 6) restarts (i.e. resets) the electronic units 7, 8, 9 upon detecting a short power interruption, when the supply voltage $V_{bat}$ drops below a pre-defined critical threshold $V_{shtd}$ and does not recover to above a pre-defined minimum threshold $V_{frd}$ for a contiguous timespan longer than a pre-determined maximum glitch period $T_{drop}$. Otherwise, the VGD triggers a shutdown of the electronic units if the supply voltage $V_{bat}$ falls below the critical level $V_{shtd}$ and does not recover to a minimum level $V_{frd}$ within the pre-determined maximum glitch timespan $T_{drop}$, which is typically less than 100 milliseconds. During this timespan the electronic units 7, 8, 9 are supplied with power from the buffer capacitor 4. Once in the low battery leakage shutdown state the electronic units 7, 8, 9 are no longer powered. External inputs or wake-up triggers are no longer monitored and the hearing device 1 consumes very little current, for instance less than 5 µA. When leaving the low battery leakage shutdown state without a defined start-up procedure, some units could be in an undefined state, when they are powered again. Only a hard power on reset (POR) can bring the electronic units 7, 8, 9 out of the low battery leakage shutdown state and into the normal operation state. This POR can for instance be triggered when the supply voltage $V_{bat}$ crosses a certain threshold $V_{POR}$ (transition from below), such that $V_{bat}$ becomes larger than $V_{POR}$. This corresponds to disconnecting and reconnecting the battery 2 from the battery contacts, whereby $V_{bat}$ first goes below and then above the $V_{POR}$ threshold level.

Minimising the battery load in the low battery leakage shutdown state not only increases the time it takes to discharge the battery 2, thus preventing deep discharge of the battery 2 for a prolonged length of time, but also increases the time it takes to discharge the buffer capacitor 4 when disconnecting the battery 2 from the battery contacts. This can lead to the problem of deadlock situations when the hearing device 1 is in the low battery leakage shutdown state and the battery 2 is replaced before the supply voltage $V_{bat}$ provided by the buffer capacitor 4 has dropped below the minimum level $V_{POR}$. In this case no POR is issued in order to recover the hearing device 1 from the low battery leakage shutdown state and force a transition into the normal operation state. In this situation the hearing device 1 may remain inoperable for the user.

The invention solves this issue by actively discharging the buffer capacitor 4 when initiating the low battery leakage shutdown state. Two different schemes are proposed for discharging the buffer capacitor 4. The first scheme utilises the battery door to which a switch 3 is operationally connected to electrically short-circuit the buffer capacitor 4 when opening the battery door. This can be done for example with a flexible metallic contact, which creates a short (i.e. an electrical connection, e.g. via the resistor 5b) when opening the battery door, hence discharging the buffer capacitor 4. Closing the battery door would remove the short (cf. also first embodiment of a discharging means presented above in connection with FIG. 1).

Figure 4:
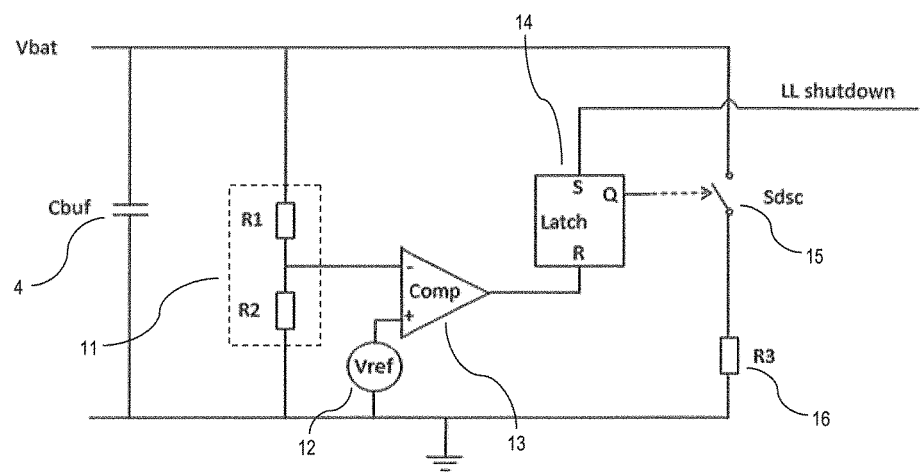
FIG. 4 a circuit diagram of an exemplary embodiment of a buffer capacitor discharging circuit for a hearing device according the present invention.

The second scheme is based on an electronic circuit. A circuit diagram of an exemplary second embodiment of a buffer capacitor discharging means 5a for a hearing device 1 according the present invention is illustrated in FIG. 4. It consists of an embedded electronic circuit, e.g. comprising a latch 14 which controls a switch that connects/disconnects a resistive load 16 to/from the battery supply $V_{bat}$, i.e. connects the two terminals of the buffer capacitor 4 with each other. The latch 14 is set by the low battery leakage shutdown signal (LL). In the example of FIG. 4 the latch is reset as soon as the supply voltage (i.e. the voltage across the buffer capacitor 4) drops below a certain level, e.g. a per-determined threshold value. The reset signal applied to the "R" input of the latch 14 is generated by a comparator 13 to which a divided $V_{bat}$ level and a reference voltage $V_{ref}$ are applied. If an LL shutdown condition is triggered due to a voltage drop, e.g. when opening the battery door, than a resistive load (R3) 16 is connected between the terminals of the buffer capacitor 4 in order to decrease the time it takes to discharge the buffer capacitor 4. When the divided voltage at the input of the comparator 13 is lower than the reference $V_{ref}$ the comparator 13 will reset the latch 14, which in turn will disconnect the resistor load (R3) 16 whilst the hearing device is kept in the LL shutdown state.

The threshold voltage $V_{ref}$ at which the load (R3) 16 gets disconnected could be programmable by employing a programmable (or trimmed) reference voltage or programmable voltage divider 11. The threshold voltage $V_{ref}$ needs to be lower than $V_{POR}$. Furthermore, $V_{ref}$ should be chosen high enough so that a battery 2 which is connected in parallel is not deeply discharged. A useful range for $V_{ref}$ is between 0.3 V to 0.7 V.

The invention claimed is:

1. A method of operating a hearing device that includes a battery compartment with a battery door, a power management unit, a loudspeaker, a plurality of electronic units, and a plurality of power gates operably connected to the plurality of electronic units, the method comprising the steps of:
   powering the plurality of electronic units with a battery in the battery compartment that provides a battery voltage;
   stabilizing the battery voltage and providing a supply voltage to the electronic units with a buffer capacitor that is connected in parallel to the battery;
   monitoring the supply voltage of at least one of the plurality of electronic units; and
   in response to a monitored low supply voltage condition, initiating a low battery leakage shutdown state by activating a power gate to disconnect the electronic unit operably connected thereto from the supply voltage and discharging the buffer capacitor in response to the battery door being opened.

2. A method as claimed in claim 1, wherein
   the electronic units comprise two or more of a control unit, a signal processing unit, a memory unit, a wireless transceiver unit, and an amplifier.

3. A method as claimed in claim 1, wherein
   the step of monitoring the supply voltage comprises at least one of (1) determining a state of charge of the battery and (2) performing supply voltage glitch detection.

4. A method as claimed in claim 3, wherein
   determining a state of charge of the battery comprises identifying a low supply voltage condition when the supply voltage drops below a minimum voltage threshold.

5. A method as claimed in claim 4, wherein
   determining a state of charge of the battery further comprises monitoring current consumed by at least one of the plurality of electronic units;
   the minimum voltage threshold depends on the monitored current consumption.

6. A method as claimed in claim 3, wherein
   performing supply voltage glitch detection comprises identifying a low supply voltage condition when the supply voltage drops below a predefined glitch threshold for a timespan longer than a predefined maximum glitch timespan.

7. A method as claimed in claim 1, wherein
   the battery compartment includes battery contacts that are connected to the battery when the battery door is closed; and
   opening the battery door disconnects the battery from the battery contacts and creates an electrical connection across the buffer capacitor to discharge the buffer capacitor.

8. A method as claimed in claim 1, further comprising:
   discontinuing the discharging of the buffer capacitor in response to the supply voltage dropping below a predefined minimum buffer voltage threshold that ranges from 0.3V to 0.7V.

9. A hearing device for use with a battery, comprising:
   a battery compartment with a battery door and a battery contacts;
   a loudspeaker;
   a plurality of electronic units;
   a buffer capacitor, operably connected to the battery contacts and to the plurality of electronic units, that stabilizes the battery voltage and provides a supply voltage to the plurality of electronic units;
   at least one power gate that connects at least one of the plurality of electronic units to the supply voltage;
   a power management unit that monitors the supply voltage and identifies a low supply voltage condition, and that controls the at least one power gate to disconnect at least one of the plurality of electronic units from the supply voltage in response to the detection of a low supply voltage condition; and
   discharge circuitry, operably connected to the buffer capacitor and to the battery door, that discharges the buffer capacitor by establishing an electrical connection between the battery contacts and ground via the discharge circuitry when the battery door is opened and that interrupts the electrical connection when the battery door is closed.

10. A hearing device as claimed in claim 9, wherein
    the electronic units comprise two or more of a control unit, a signal processing unit, a memory unit, a wireless transceiver unit, and an amplifier.

11. A hearing device as claimed in claim 9, wherein
    the power management unit is adapted to determine a charge state of the battery.

12. A hearing device as claimed in claim 11, wherein
the power management unit is adapted to detect a low supply voltage condition when the supply voltage drops below a minimum voltage threshold.

13. A hearing device as claimed in claim 12, wherein
the power management unit is adapted to monitor current consumption of at least one of the electronic units and to set or adjust the minimum voltage threshold in response to the monitored current consumption.

14. A hearing device as claimed in claim 12, wherein
the discharge circuitry also discharges the buffer capacitor in response to detection of a low supply voltage condition.

15. A hearing device as claimed in claim 9, wherein
the power management unit is adapted to detect a supply voltage glitch.

16. A hearing device as claimed in claim 15, wherein
the power management unit detects the supply voltage glitch by detecting when the supply voltage drops below a predefined glitch threshold for a timespan longer than a predefined maximum glitch timespan.

17. A hearing device as claimed in claim 9, wherein
the discharge circuitry discontinues discharging when voltage across the buffer capacitor drops below a predefined minimum buffer voltage threshold.

18. A hearing device as claimed in claim 17, wherein
the predefined minimum buffer voltage threshold ranges from 0.3V to 0.7V.

19. A hearing device for use with a battery, comprising:
a battery compartment with a battery door and a battery contacts;
a loudspeaker;
a plurality of electronic units;
a buffer capacitor, operably connected to the battery contacts and to the plurality of electronic units, that stabilizes the battery voltage and provides a supply voltage to the plurality of electronic units;
at least one power gate that connects at least one of the plurality of electronic units to the supply voltage;
a power management unit that monitors the supply voltage and identifies a low supply voltage condition, and that controls the at least one power gate to disconnect at least one of the plurality of electronic units from the supply voltage in response to the detection of a low supply voltage condition; and
discharge means, operably connected to the buffer capacitor and to the battery door, for discharging the buffer capacitor by establishing an electrical connection between the battery contacts and ground via the discharge circuitry when the battery door is opened and that interrupts the electrical connection when the battery door is closed.

20. A hearing device as claimed in claim 17, wherein
the power management unit is adapted to determine a charge state of the battery and to detect a low supply voltage condition when the supply voltage drops below a minimum voltage threshold; and
the discharge means discharges the buffer capacitor in response to detection of a low supply voltage condition.

21. A method as claimed in claim 1, wherein
discharging the buffer capacitor comprises actively discharging the buffer capacitor by establishing a parallel connection between the buffer capacitor and a resistor in response to the battery door being opened.

22. A hearing device as claimed in claim 9, wherein
the discharge circuitry establishes a parallel connection between the battery contacts and a resistor when the battery door is opened and that interrupts the parallel connection between the battery contacts and the resistor when the battery door is closed.

* * * * *